US008058906B2

(12) United States Patent
Niemier et al.

(10) Patent No.: US 8,058,906 B2
(45) Date of Patent: Nov. 15, 2011

(54) NON-MAJORITY MQCA MAGNETIC LOGIC GATES AND ARRAYS BASED ON MISALIGNED MAGNETIC ISLANDS

(75) Inventors: Michael T. Niemier, Granger, IN (US); Mohammad T. Alam, Berkeley, CA (US); Gary H. Bernstein, Granger, IN (US); Xiaobo Sharon Hu, Granger, IN (US); Wolfgang Porod, Granger, IN (US); Edit Varga, Gyula (HU)

(73) Assignee: The University of Notre Dame Du Lac, Notre Dame, IN (US)

( * ) Notice: Subject to any disclaimer, the term of this patent is extended or adjusted under 35 U.S.C. 154(b) by 0 days.

(21) Appl. No.: 12/816,777

(22) Filed: Jun. 16, 2010

(65) Prior Publication Data
US 2010/0315123 A1    Dec. 16, 2010

Related U.S. Application Data

(60) Provisional application No. 61/268,803, filed on Jun. 16, 2009, provisional application No. 61/243,246, filed on Sep. 17, 2009.

(51) Int. Cl.
*H03K 19/20*    (2006.01)
*H03K 19/21*    (2006.01)
*G06F 7/50*    (2006.01)

(52) U.S. Cl. .......... 326/104; 326/52; 977/940; 977/859

(58) Field of Classification Search ............ 326/52–56, 326/104; 977/940, 859
See application file for complete search history.

(56) References Cited

U.S. PATENT DOCUMENTS

| | | | |
|---|---|---|---|
| 6,034,887 A * | 3/2000 | Gupta et al. | 365/171 |
| 7,212,026 B2 * | 5/2007 | Bourianoff et al. | 326/7 |
| 7,635,993 B2 * | 12/2009 | Boeve | 326/136 |
| 7,652,398 B2 * | 1/2010 | Koch et al. | 307/407 |
| 7,825,686 B2 * | 11/2010 | Hoeink et al. | 326/38 |
| 2006/0091914 A1 * | 5/2006 | Bourianoff et al. | 326/104 |
| 2006/0145806 A1 * | 7/2006 | Kim et al. | 336/200 |
| 2007/0290717 A1 * | 12/2007 | Bangert | 326/38 |
| 2009/0290408 A1 * | 11/2009 | Lou et al. | 365/158 |

(Continued)

OTHER PUBLICATIONS

Charles Augustine, "A Design Methodology and Device/Circuit/Architecture Compatible Simulation Framework for Low-Power Magnetic Quantum Cellular Automata Systems", Design Automation Conference, 2009. ASP-DAC 2009. Asia and South Pacific, Jan. 19-22, 2009, pp. 847-852.

(Continued)

*Primary Examiner* — Shawki S Ismail
*Assistant Examiner* — Dylan White
(74) *Attorney, Agent, or Firm* — Keith R. Jarosik

(57) ABSTRACT

A non-majority magnetic logic gate device for use in constructing compact and power efficient logical magnetic arrays is presented. The non-majority magnetic logic gate device includes a substrate, symmetrically aligned magnetic islands (SAMIs), at least one misaligned magnetic island (MAMI), magnetic field inputs (MFIs), and at least one magnetic field output (MFO). The SAMIs and MAMI are electrically isolated from each other but are magnetically coupled to one another through their respective magnetic fringe fields. The MAMI is geometrically and/or angularly configured to exhibit a magnetization ground state bias which is dependent upon which direction the applied magnetic clock field is swept. Non-majority logic gates can be made from layouts containing the SAMIs and the MAMI which contain a smaller number of components as comparable majority logic gate layouts.

33 Claims, 14 Drawing Sheets

U.S. PATENT DOCUMENTS

| | | | |
|---|---|---|---|
| 2010/0028530 A1* | 2/2010 | Parkin | 427/130 |
| 2010/0039136 A1* | 2/2010 | Chua-Eoan et al. | 326/38 |
| 2010/0225350 A1* | 9/2010 | Hoeink et al. | 326/38 |
| 2011/0069536 A1* | 3/2011 | Lou et al. | 365/158 |

OTHER PUBLICATIONS

H. Koop, et al; "Shape dependence of the magnetization reversal in sub-µm magnetic tunnel junctions", Journal of Magnetism and Magnetic Materials, vols. 272-276, Supplement 1, May 2004, pp. E1475-E1476, Proceedings of the International Conference on Magnetism (ICM 2003).

A. Imre, et al; "Majority Logic Gate for Magnetic Quantum-Dot Cellular Automata", Science, Jan. 13, 2006, vol. 311, No. 5758, pp. 205-2083.

M. Bode, et al; "Shape-Dependent Thermal Switching Behavior of Superparamagnetic Nanoislands", Physical Review Letters, vol. 92, No. 6, Week Inding Feb. 13, 2004, pp. 067201-1 to 067201-4.

Anand Subra Mani, et al; "Effect of Controlled Asymmetry on the Switching characteristics of Ring-based MRAM Design", IEEE Transactions on Nanotechnology, vol. 5, No. 3, May, 2006, pp. 249-254.

Alexandra Imre, et al; "Investigation of shape-dependent switching of coupled nanomagnets", Supeerlattices and Microstructures, vol. 34, Issues 3-6, Sep.-Dec. 2003, pp. 513-518.

David B. Carlton, et al; "Simulation Studies of Nanomagnet-Based Logic Architecure", Nano Letters, 2008, vol. 8, No. 12, pp. 4173-4178, Publication Date (Web): Nov. 17, 2008.

OOMMF (Object Oriented Micromagnetic Framework) User's Guide, Feb. 23, 2000, This manual documents release 1.0b3, 87 pages.

Michael Niemier, et al; "Bridgig the Gap between Nanomagnetic Devices and Circuits", 2008 IEEE International Conference on Computer Design, vol. 2, Issue 1, Publisher: IEEE, pp. 506-513, Oct. 12-15, 2008.

Michael Niemier, et al; "Shape engineering for controlled switching with nanomagnet logic", IEEE Transactions on Nanotechnology, Issue 99, pp. 1-11; Date of Publication: Jul. 8, 2010.

Federico M. Spedalieri, et al; "Performance of Magnetic Quantum Cellular Automata and Limitations Due to Thermal Noise", IEEE Transactions on Nanotechnology, vol. 10, No. 3, May 2011, pp. 537-546, Date of Publication: May 27, 2010.

R.P. Cowburn, et al; "Room Temperature Magnetic Quantum Cellular Automata", Solent, vol. 287, Feb. 25, 2000, pp. 1466-1468.

Behtash Behin-Aein, et al; "Switching Energy of Ferromagnetic Logic Bits", IEEE Transactions on Nanotechnology, vol. 8, No. 4, Jul. 2009, pp. 505-514.

M.T. Niemier, et al; "Clocking Structures and Power Analysis for Nanomagnet-Based Logic Devices", Low Power Electronics and Design (ISLPED), 2007 ACM/IEEE International Symposium on, Aug. 27-29, 2007, pp. 26-31.

Mohmmad Tanvir Alam, et al; "On-Chip Clocking for Nanomagnet Logic i Devices", IEEE Transaction on Nanotechnology, vol. 9, No. 3, May 2010, pp. 348-351.

Norikazu Ohshima, et al; "Magnetic Properties and Writing Characteristics of Magnetic Clad Lines in Magnetoresistive Random Access Memory Devices"Japanese Journal of Applied Physics, vol. 47, No. 5, 2008, pp. 3456-3460, Published online May 16, 2008.

Aaron Dingler, et al; "Controlling Magnetic Circuits: How Clock Structure Implementation will Impact Logical Correctness and Power", Published in: Proceeding DFT 09 Proceedings of the 2009 $24^{th}$ IEEE International Symposium On Defect and Fault Tolerance in Vlsi Systems, Oct. 7-Oct. 9, pp. 94-102.

Craig S. Lent, et al; "A Device Architecture for Computing with Quantum Dots", Proceedings of the IEEE, vol. 85, No. 4, Apr. 1997, pp. 541-557.

Aaron Dingler, et al; "System-Level Energy and Performance Projections for Nanomagnet-based Logic", IEEE/ACM International Symposium on Nanoscale Architectures,Jul. 30-31, 2009, pp. 21-26.

Edit Varga, et al; "Non-volatile and Reprogrammable MQCA-based Majority Gates", Device Research Conference, 2009, DRC Jun. 22-24, 2009, pp. 1 and 2.

R. Ramesh, et al; "Multiferroics: progress and prospects in thin films", Nature Materials, vol. 6, Jan. 2007, pp. 21-29.

M.T. Alam, et al; Fabrication of On-Chip Clock Structure for Nanomagnet QCA (MQCA), Nanotechnology, IEEE Transactions on, May 2010, vol. 9, Issue 3, pp. 348-351.

G.H. Bernstein, et al; "Magnetic QCA systems", Microelectronics Journal vol. 36, Issue 7, Jul. 2005, pp. 619-624.

Michael Niemier, et al; "Fabrication Variations and Defect Tolerance for Nanomagnet-based QCA", 2008 IEEE International Symposium on Defect and Fault Tolerance of VLSI Systems, Oct. 1-Oct. 3, 9 pages.

L.K. Verma, et al; "Magnetic domain patterns in a zigzag nanowire", Journal of Magnetism and Magnetic Materials, vol. 313, Issue 2, Jun. 2007, pp. 317-321.

G. Csaba, et al; "Simulation of Power Gain and Dissipation in Field-Coupled Nanomagnets", Journal of Computational Electronics, vol. 4, Nos. 1-2, pp. 105-110 (2005).

Scott Whittenburg; Micromagnetics simulation of deep-submicron sup0ermalloy disks, Nov. 1, 2001; Chemistry Faculty Publications Department of Chemistry, University of New Orleans, 4 pages.

Johan Akerman, et al; "Demonstrated Reliability of 4-Mb MRAM", IEEE Transactions on Device and Materials Reliability, vol. 4, No. 3, Sep. 2004, pp. 428-435.

Gary H. Bernstein, et al;"New high-contrast developers for poly(methyl methacrylate) resist"J. Appl, Phys 71(8) Apr. 15, 1992, pp. 4066-4075.

Kevin Hennessy, et al; "Clocking of molecular quantum-dot cellular automata", J. Vac. Sci. technol. B 19(5), Sep.Oct. 2001, pp. 1752-1755.

Alexandra Imre, "Experimental Study of Nanomagnets For Magnetic Quantum-Dot Cellular Automata (MQCA) Logic Applications", A Dissertation Submitted to the Graduate School of the University of Notre Dame in Partial Fulfillments of the Requirements for the Degree of Doctor of Philosophy, Graduate Program in Electrical Engineering, Notre Dame, Indiana, Apr. 2005, 112 pages.

* cited by examiner

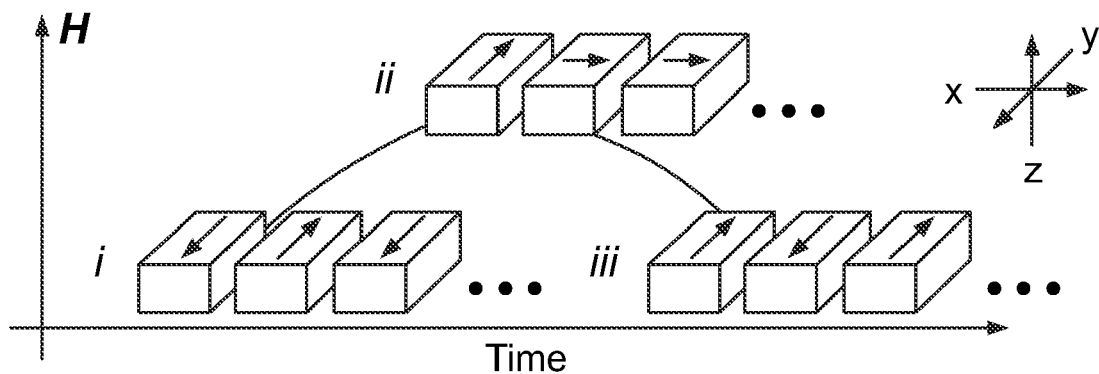
FIG. 3
(PRIOR ART)
Majority Gate Based AND
Logic 0 = ↓, Logic 1 = ↑
A=0, B=0, Out=0
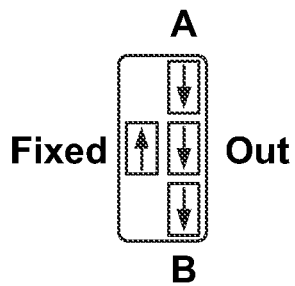
A=0, B=1, Out=0
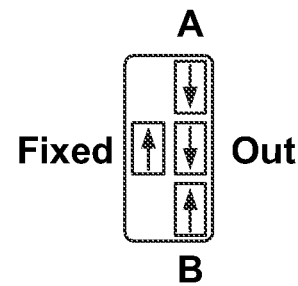
A=1, B=0, Out=0
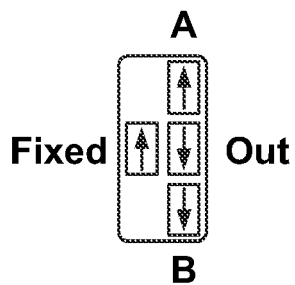
A=1, B=1, Out=1
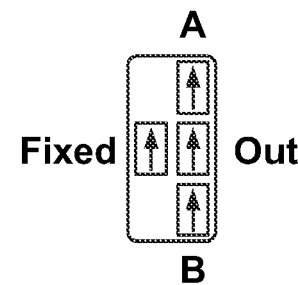
FIG. 4
(PRIOR ART)

Majority Gate Based OR
Logic 0 = ↓, 1 = ↑
A=0, B=0, Out=0
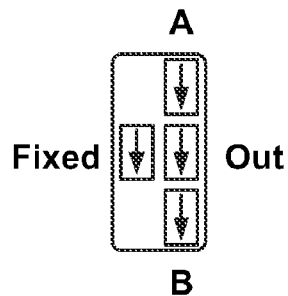
A=0, B=1, Out=1
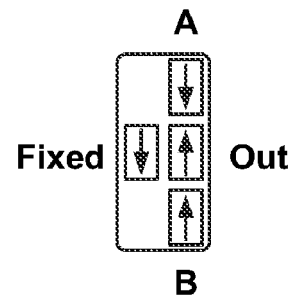
A=1, B=0, Out=1
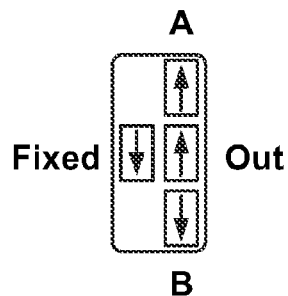
A=1, B=1, Out=1
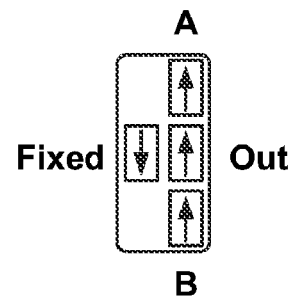
FIG. 5
(PRIOR ART)
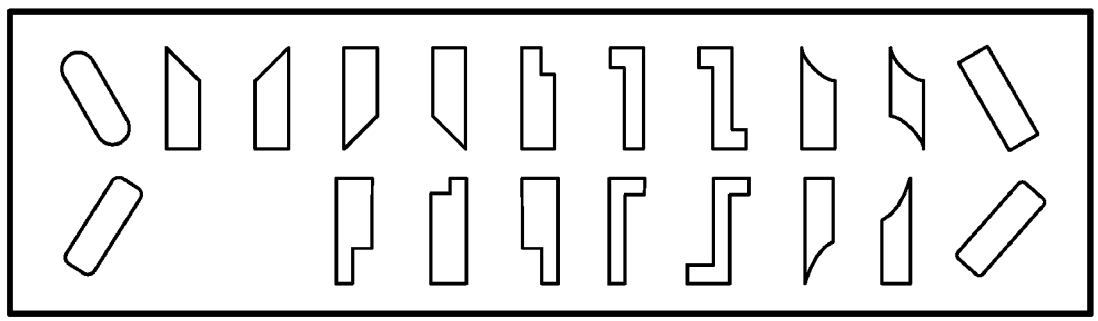
FIG. 6

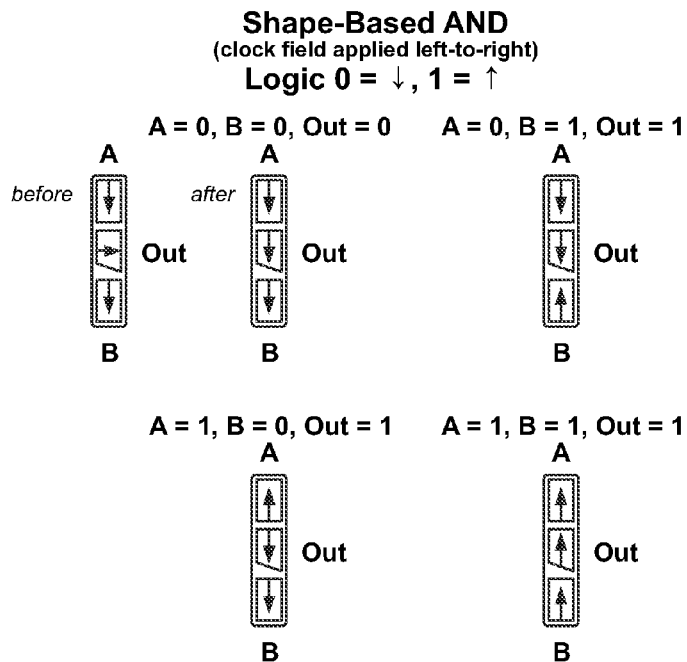

Shape-Based AND
(clock field applied left-to-right)
Logic 0 = ↓, 1 = ↑

FIG. 7

Minority based AND logic gate

Case 1
Sweeping LEFT to RIGHT
with M's top left edge misaligned

| A, B | AB | M ASYMMETRIC |
|---|---|---|
| INPUT SPINS STATES | INPUT LOGIC STATES | SPIN, OUTPUT LOGIC STATES |
| ↓, ↓ | 0, 0 | ↓, 0 |
| ↓, ↑ | 0, 1 | ↓, 0 |
| ↑, ↓ | 1, 0 | ↓, 0 |
| ↑, ↑ | 1, 1 | ↑, 1 |

Case 2
Sweeping LEFT to RIGHT
with M's bottom right edge misaligned

| A, B | AB | M ASYMMETRIC |
|---|---|---|
| INPUT SPINS STATES | INPUT LOGIC STATES | SPIN, OUTPUT LOGIC STATES |
| ↓, ↓ | 0, 0 | ↓, 0 |
| ↓, ↑ | 0, 1 | ↓, 0 |
| ↑, ↓ | 1, 0 | ↓, 0 |
| ↑, ↑ | 1, 1 | ↑, 1 |

Case 3
Sweeping RIGHT to LEFT
with top right edge misaligned

| A, B | AB | M ASYMMETRIC |
|---|---|---|
| INPUT SPINS STATES | INPUT LOGIC STATES | SPIN, OUTPUT LOGIC STATES |
| ↓, ↓ | 0, 0 | ↓, 0 |
| ↓, ↑ | 0, 1 | ↓, 0 |
| ↑, ↓ | 1, 0 | ↓, 0 |
| ↑, ↑ | 1, 1 | ↑, 1 |

Case 4
Sweeping RIGHT to LEFT
with bottom left edge misaligned

| A, B | AB | M ASYMMETRIC |
|---|---|---|
| INPUT SPINS | INPUT LOGIC STATES | SPIN, LOGIC STATES |
| ↓, ↓ | 0, 0 | ↓, 0 |
| ↓, ↑ | 0, 1 | ↓, 0 |
| ↑, ↓ | 1, 0 | ↓, 0 |
| ↑, ↑ | 1, 1 | ↑, 1 |

FIG. 8

Shape-Based OR
(clock field applied left-to-right)
Logic 0 = ↓, 1 = ↑

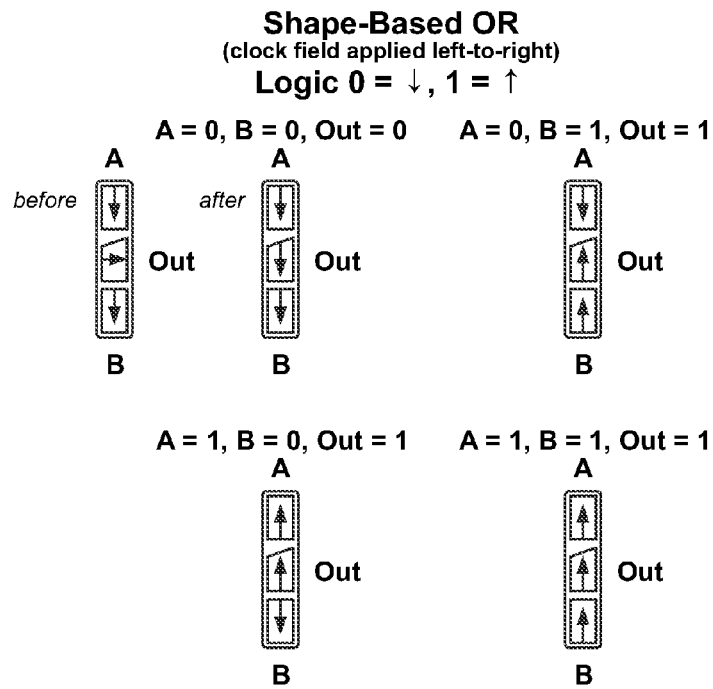

FIG. 9

All cases of Minority based OR logic gate

Case 1
Sweeping LEFT to RIGHT
with M's top left edge misaligned

| A, B | AB | MASYMMETRIC |
|---|---|---|
| INPUT SPINS STATES | INPUT LOGIC STATES | SPIN, OUTPUT LOGIC STATES |
| ↓, ↓ | 0, 0 | ↓, 0 |
| ↓, ↑ | 0, 1 | ↑, 1 |
| ↑, ↓ | 1, 0 | ↑, 1 |
| ↑, ↑ | 1, 1 | ↑, 1 |

Case 2
Sweeping LEFT to RIGHT
with bottom right edge misaligned

| A, B | AB | MASYMMETRIC |
|---|---|---|
| INPUT SPINS STATES | INPUT LOGIC STATES | SPIN, OUTPUT LOGIC STATES |
| ↓, ↓ | 0, 0 | ↓, 0 |
| ↓, ↑ | 0, 1 | ↑, 1 |
| ↑, ↓ | 1, 0 | ↑, 1 |
| ↑, ↑ | 1, 1 | ↑, 1 |

Case 3
Sweeping RIGHT to LEFT
with top right edge misaligned

| A, B | AB | MASYMMETRIC |
|---|---|---|
| INPUT SPINS STATES | INPUT LOGIC STATES | SPIN, OUTPUT LOGIC STATES |
| ↓, ↓ | 0, 0 | ↓, 0 |
| ↓, ↑ | 0, 1 | ↑, 1 |
| ↑, ↓ | 1, 0 | ↑, 1 |
| ↑, ↑ | 1, 1 | ↑, 1 |

Case 4
Sweeping RIGHT to LEFT
with bottom left edge misaligned

| A, B | AB | MASYMMETRIC |
|---|---|---|
| SPIN STATES | INPUT LOGIC STATES | SPIN, LOGIC STATES |
| ↓, ↓ | 0, 0 | ↓, 0 |
| ↓, ↑ | 0, 1 | ↑, 1 |
| ↑, ↓ | 1, 0 | ↑, 1 |
| ↑, ↑ | 1, 1 | ↑, 1 |

FIG. 10

All cases of Minority based NAND logic gates

Case 1
Sweeping LEFT to RIGHT
with M's top right edge misaligned

| A, B INPUT SPINS STATES | AB INPUT LOGIC STATES | ASYMMETRIC SPIN, OUTPUT LOGIC STATES |
|---|---|---|
| →, → | 0, 0 | ↑, 1 |
| →, ← | 0, 1 | ↑, 1 |
| ←, → | 1, 0 | ↑, 1 |
| ←, ← | 1, 1 | ↓, 0 |

Case 2
Sweeping LEFT to RIGHT
with M's bottom left edge misaligned

| A, B INPUT SPINS STATES | AB INPUT LOGIC STATES | ASYMMETRIC SPIN, OUTPUT LOGIC STATES |
|---|---|---|
| →, → | 0, 0 | ↑, 1 |
| →, ← | 0, 1 | ↑, 1 |
| ←, → | 1, 0 | ↑, 1 |
| ←, ← | 1, 1 | ↓, 0 |

Case 3
Sweeping RIGHT to LEFT
with M's top left edge misaligned

| A, B INPUT SPINS STATES | AB INPUT LOGIC STATES | ASYMMETRIC SPIN, OUTPUT LOGIC STATES |
|---|---|---|
| →, → | 0, 0 | ↑, 1 |
| →, ← | 0, 1 | ↑, 1 |
| ←, → | 1, 0 | ↑, 1 |
| ←, ← | 1, 1 | ↓, 0 |

Case 4
Sweeping RIGHT to LEFT
with M's bottom right edge misaligned

| A, B INPUT SPINS | AB INPUT LOGIC STATES | ASYMMETRIC SPIN, LOGIC STATES |
|---|---|---|
| →, → | 0, 0 | ↑, 1 |
| →, ← | 0, 1 | ↑, 1 |
| ←, → | 1, 0 | ↑, 1 |
| ←, ← | 1, 1 | ↓, 0 |

FIG. 11

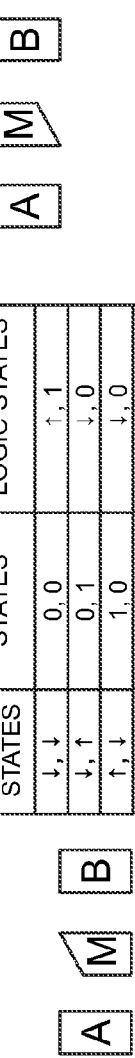
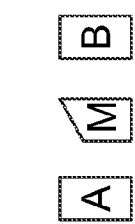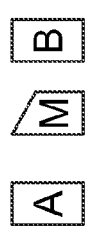
FIG. 12

Shape-based XOR (all combos)
(assume clock field applied left-to-right)

NON-MAJORITY MQCA MAGNETIC LOGIC GATES AND ARRAYS BASED ON MISALIGNED MAGNETIC ISLANDS

CROSS-REFERENCE TO RELATED PATENT APPLICATION

This application claims the benefit of U.S. Provisional Applications 61/268,803 and 61/243,246, which were respectively filed on Jun. 16, 2009, and on Sep. 17, 2009, and which are incorporated herein in their entirety by reference.

GOVERNMENT INTERESTS

This invention was funded, at least in part, with a government grant from the National Institute of Standards and Technology (NIST) pursuant to contract number 70NANB7H6168. This invention was also funded, at least in part, with a government support under Grant No. CCF-0621990 entitled "Nano: Applications, Architectures, and Circuit Design for Nano-scale Magnetic Logic Devices" awarded by the National Science Foundation (NSF). Accordingly, the United States government may therefore have certain rights in this invention.

FIELD OF THE DISCLOSURE

The present disclosure relates to magnetic quantum-dot cellular automata, more particular to non-majority magnetic logic gates and arrays based on misaligned magnetic islands.

BACKGROUND

Nanomagnetic logic (NML), also known as, Magnetic Quantum-Dot Cellular Automata (MQCA) consists of using nanomagnetic islands arranged in such a way that allows logic functions to be performed by using NML circuits. Wires, gates, and inverters have already been demonstrated to function at room temperature. It is estimated that if $10^{10}$ magnets switch at $10^8$ times/second, then the magnets would only dissipate about 0.1 W of power. These nanomagnet based devices can remain non-volatile provided that their size/shape remains above the superparamagnetic limit which means that these nanomagnets devices can be used to realize both logic and memory devices. If non-volatility can be sacrificed, research suggests that binary state in nanomagnets with feature sizes below the superparamagnetic limit should also be stable for around 1 millisecond. This retention time is sufficient to perform logic operations. Device switching times could also be reduced.

The fundamental building blocks for NML circuits can (i) be made with standard lithographic techniques and (ii) have all been experimentally demonstrated at room temperature. Wires that exhibit ferromagnetically ordering (FIG. 1a-c) can be formed by orienting rectangular magnets next to each other so that their magnetic poles are within a commonly shared axis as shown in the FIG. 1a-c. Likewise anti-ferromagnetically coupled bit wires can be formed by orienting rectangular magnets next to each other so that their magnetic poles are parallel to each other and not within a commonly shared axis as shown in FIG. 2a-c.

Because the energy difference between magnetization (binary) states in an NML device can be hundreds of kT at room temperature, an applied magnetic clock is needed to facilitate the re-evaluation of an NML ensemble subsequent to when input states are changed. The applied magnetic clock provides the necessary energy that modulates the barrier between magnetization states so that fringing fields from individual magnets can quickly bias neighboring magnets into their respective thermodynamically favorable magnetization state that corresponds to the logically correct output states associated with the input(s). This reordering of magnetization states is guided by either antiferromagnetic or ferromagnetic coupling which is dependent upon the relative positions of how the particularly adjacent magnets are geometrically arranged.

For example, reordering of magnetization states in an anti-ferromagnetic coupled horizontal line would proceed as shown in FIG. 3-i to FIG. 3-iii (where just 3 devices are shown for simplicity). After the field of the left most magnet is externally driven by an Input (not shown) to flip its magnetic state, the applied magnetic clock field (H) is then subsequently imposed on all of the magnets (e.g., in an antiferromagnetically ordered line) which drives the internal magnetic fields (sideways arrows) of the center and right most magnets to be biased along their hard (shorter) axes (as shown in the transition from FIG. 3-i to FIG. 3-ii). Note that the internal magnetic field (up arrow) of the left most magnet is unaffected by the applied magnetic clock field (H) because it remains biased along its easy (long) axis driven by the continued imposition of the external magnetic field at the Input (not shown). As a result of imposing the applied magnetic clock field which drives the internal magnetic fields of the center and right most magnets pointed towards their hard axes (i.e., nullify), the energetic barriers of the center and right most magnets needed to reach their new energetically favorable magnetization state are considerably lowered. Flux from neighboring magnets can then efficiently bias these magnets into a new magnetically stable state (FIG. 3-iii) when the applied magnetic clock field (H) is removed.

It is known that fringing field-based interactions between single domain magnets with nanometer feature sizes can be used as a driving force to perform Boolean logic operations. With NML, logic functionality results from a complex interplay of shape anisotropy and magnet-to-magnet coupling. Magnet shape anisotropy, i.e., an elongated easy axis, creates a bi-stable system, and binary values (1/0) can be arbitrarily assigned to different magnetization directions. For many magnet shapes, the easy axis states are energetically equivalent for a magnet in isolation. When considering magnet ensembles, in clocked systems, fringing fields from individual devices can set the state of a neighboring device when that device is in a metastable logic state. It is known that these fringing field interactions can be used to implement majority voting gates and, in principle, implement any Boolean function.

To date, all known proposals for Boolean logic designs using NML architecture have either been majority gate based or assumed magnets with a uniform shape. Majority gates can be transformed into AND/OR or NAND/NOR gates and can be used to implement any Boolean function (as for AND/OR gates, inversion is possible with an antiferromagnetically ordered wire with an odd number of devices). One way of transforming a majority gate into either a AND/OR or NAND/NOR gate configuration is to permanently fix one of the inputs to a logic 0 or logic 1. Thus, Boolean logic can be realized using majority voting gates by arbitrarily setting one input of a majority gate to a logic '0' or '1', to transform the gate to a two input AND/OR gate. However, reducing a clocked majority gate to a 2-input AND/OR gate is non-trivial. The fixed/held input must be designed such that it does not impede the switching of the compute magnet (e.g., by providing too strong of a bias). If this does happen, a stuck-at fault will ensue as the two other inputs will not be able to drive the gate to a logically correct state.

Some advantages of NML designs include high scalability with ultra-low active power and essentially zero leakage power. NML are also thought to be inherently radiation resistant. To date, known NML designs have utilized elementary symmetrical shapes, i.e., rectangular and ellipsoid devices, have been used for majority gate logic designs.

As depicted in FIGS. 4-5, majority logic gates (MLG) have been used as a basis to demonstrate that magnetic quantum-dot cellular automata (MQCA) can be used to successfully implement various Boolean logic functions. Magnetic logic manipulates spin-polarized electrons in the magnetic material where information can be arbitrarily correlated with either "spin up" or "spin down" electrons. However, not all Boolean functions map well to majority voting gates (i.e. XOR). More specifically, an XOR gate constructed from majority gate-based AND/OR logic will likely require a relatively large footprint.

BRIEF DESCRIPTION OF THE DRAWINGS

The invention will be better understood and aspects other than those set forth above will become apparent when consideration is given to the following detailed description thereof. Such description makes reference to the annexed drawings wherein:

FIGS. 3*i-iii* is a stylistic portrayal of a magnetic state reordering along an antiferromagnetically coupled bit line;

FIG. 4 depicts one majority gate based AND logic gate layout showing four operational magnetic vector combinations and their respective outcome;

FIG. 5 depicts one majority gate based OR logic gate layout showing four operational magnetic vector combinations and their respective outcome and their respective outcome;

FIG. 6 illustrates some of the geometric and angular misalignment configurations through to be possible for MAMI of the present invention;

FIG. 7 is one non-majority based AND logic gate layout and sweeping scenario showing four operational magnetic vector combinations and their respective outcome of the present invention;

FIG. 8 depicts four possible layouts and sweeping scenarios forming non-majority based AND logic gates of the present invention;

FIG. 9 is one non-majority based OR logic gate layout of the present invention showing all four operational magnetic vector combinations and their respective outcome;

FIG. 10 depicts four layouts and sweeping scenarios forming non-majority based OR logic gates of the present invention;

FIG. 11 depicts four layouts and sweeping scenarios forming non-majority based NAND logic gates of the present invention;

FIG. 12 depicts four layouts and sweeping scenarios forming shaped based NOR logic gates of the present invention;

The same reference numerals refer to the same parts throughout the various figures.

DETAILED DESCRIPTION

Figure 1:
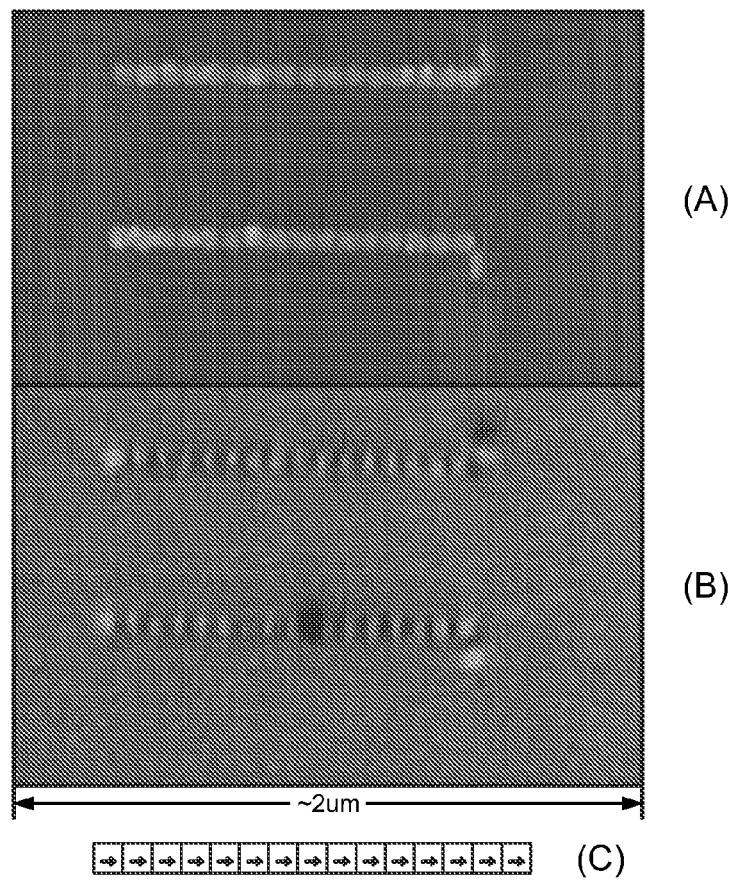
FIGS. 1A-C are a Scanning Electron Micrograph (SEM) Image, Magnetic Force Microscopy (MFM) Image and an arbitary magnetic field vector corresponding to a ferromagnetically coupled bit line.
Figure 2:
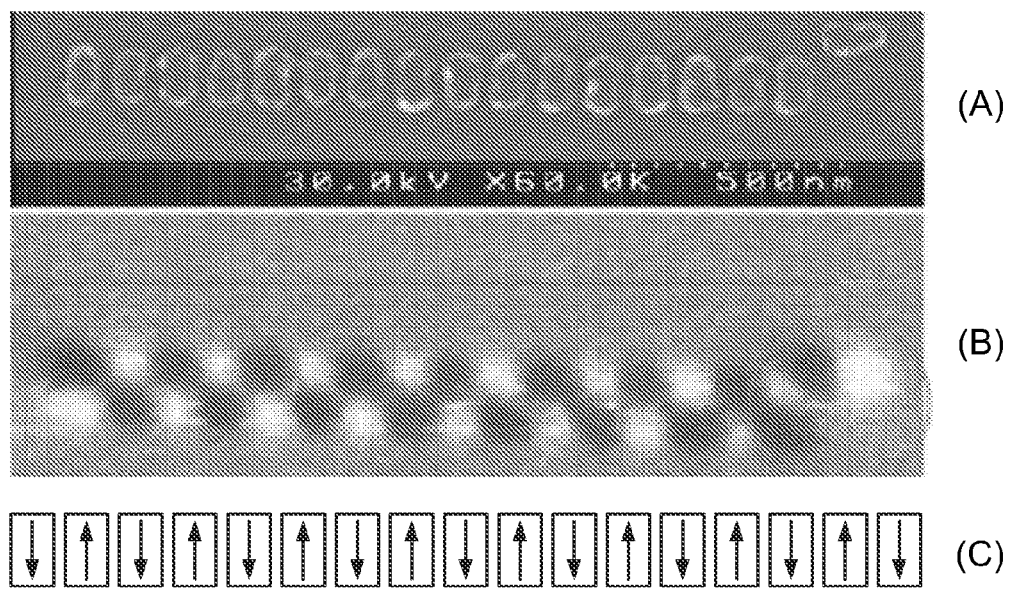
FIGS. 2A-C are a SEM Image, MFM Image and an arbitary magnetic field vector corresponding to an antiferromagnetically coupled bit line.
Figure 13:
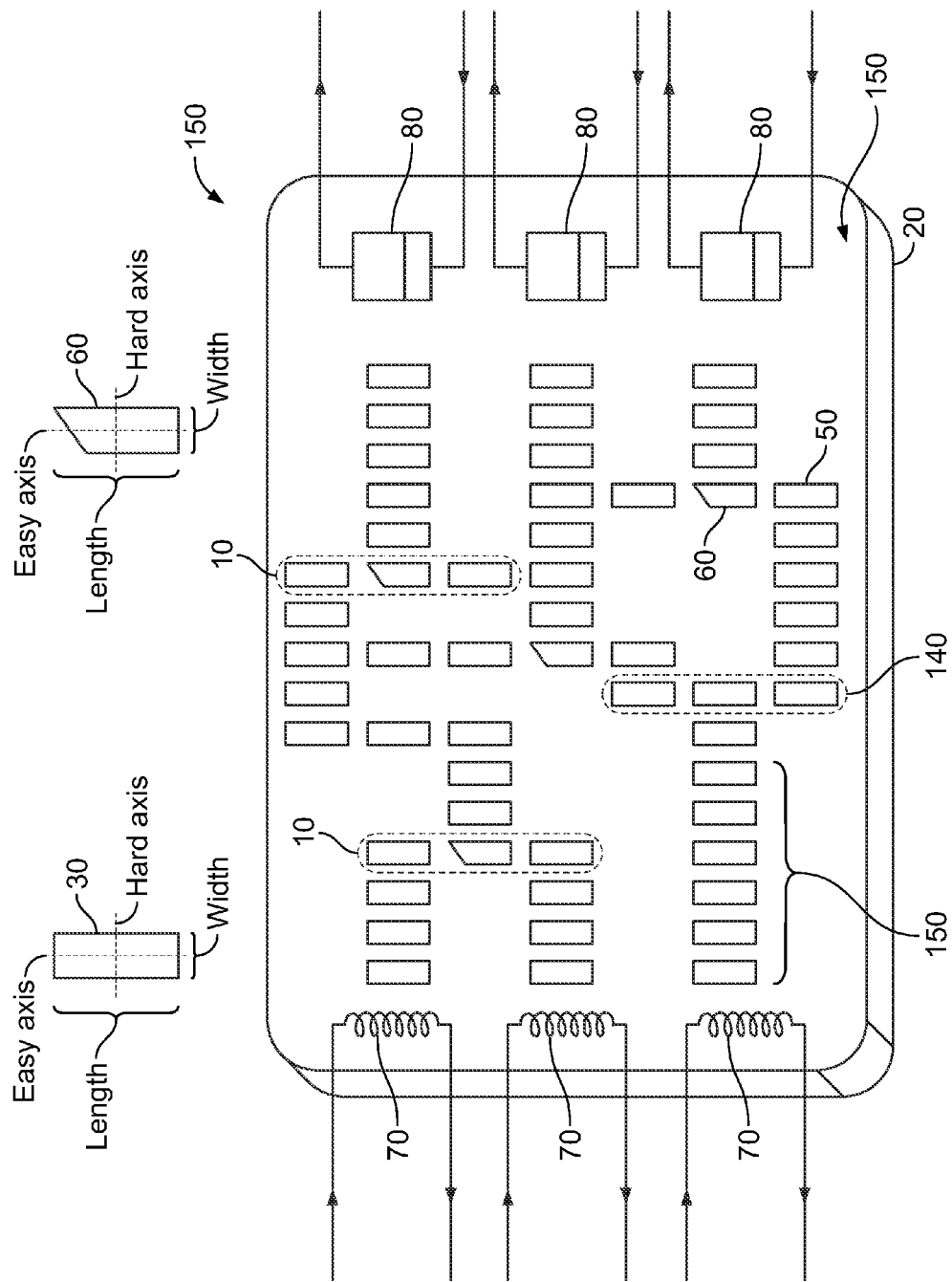
FIG. 13 is a perspective view of a magnetic logic gate array of the present invention.
Figure 14:
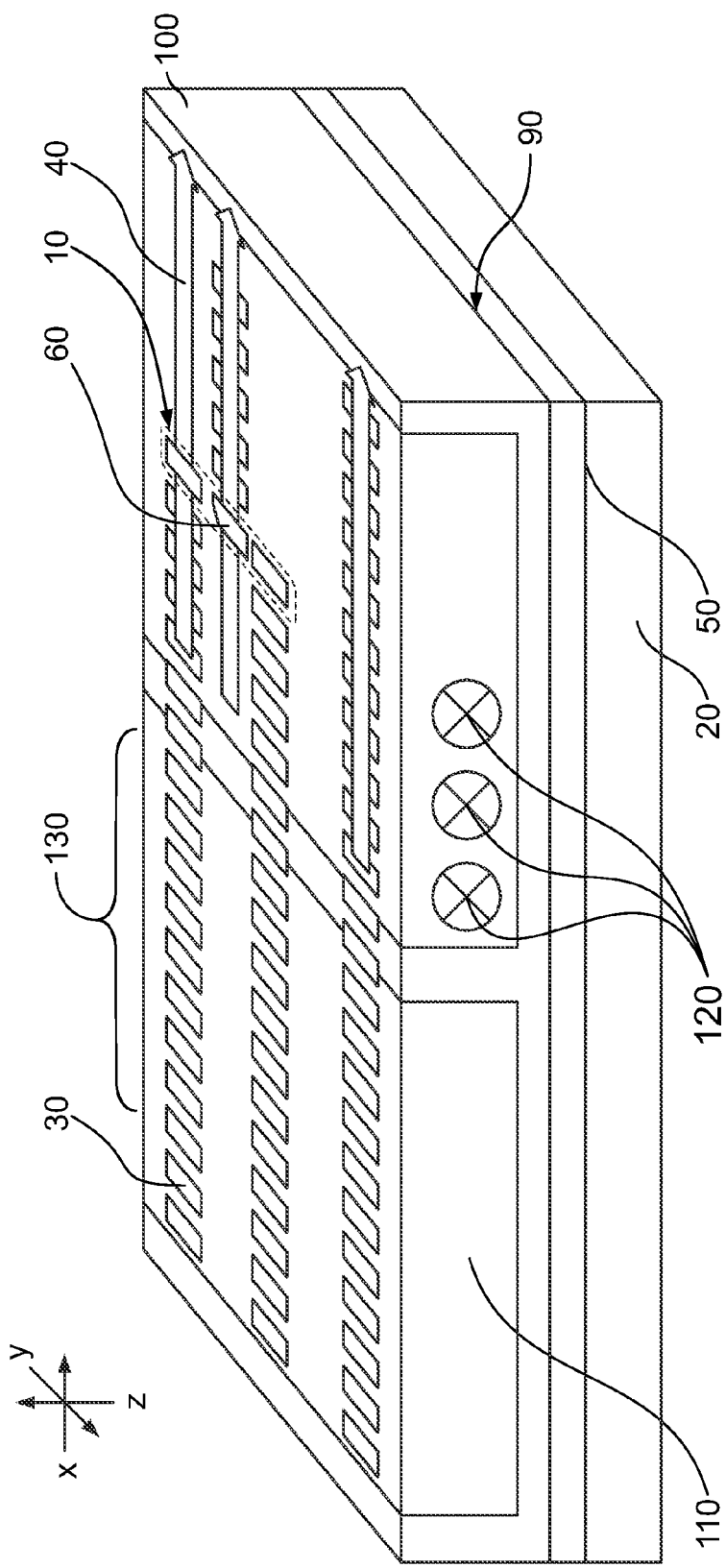
FIG. 14 is a perspective view of a non-majority magnetic logic gate device of the present invention.

Referring now to the drawings, and in particular FIGS. 1-3, 6-16, and 21 thereof, one envisioned example of the non-majority magnetic logic gate device 10, such as those shown in FIGS. 13-14, comprises a substrate 20; a plurality of symmetrically aligned magnetic islands (SAMIs 30), a misaligned magnetic island (MAMI 60), a plurality of magnetic field inputs (MFIs 70) and at least one magnetic field output (MFO 80). The SAMIs 30 are disposed on the substrate 20 so that most of the SAMIs 30 are disposed either substantially perpendicular or substantially in parallel relative to a sweeping direction of an applied magnetic clock field 40 and such that the applied magnetic clock field 40 is applied substantially parallel or perpendicular to a plane 50 of the substrate 20. Most of the SAMIs 30 have lengths longer than their widths which respectively define easy and hard magnetic axes. Most of the SAMIs 30 are electrically isolated from each other. Of those SAMIs 30 that are symmetrically aligned lengthwise side by side next to each other tend towards exhibiting antiferromagnetic coupling with each other. Of those SAMIs 30 that are symmetrically aligned widthwise side by side next to each other tend towards exhibiting ferromagnetic coupling with each other. The MAMI 60 is also disposed on the substrate 20 and the MAMI 60 also has a length longer than a width that respectively define easy and hard magnetic axes. The MAMI 60 is electrically isolated from the SAMIs 30 but the MAMI 60 is magnetically coupled and sandwiched in between two SAMIs 30. The MAMI 60 is configured to exhibit a magnetization ground state bias which is dependent upon the sweeping direction of the applied magnetic clock field 40. The MFIs 70 are disposed on the substrate 20 and are magnetically coupled to some of the SAMIs 30. The MFO 80 is disposed on the substrate 20 and magnetically coupled to the MAMI 60.

The clocking of the applied magnetic clock field 40 may be at any frequency. Some envisioned clocking frequencies of that the applied magnetic clock field 40 are between 1 Hz to about 1 GHz.

The strength of the applied magnetic clock field 40 is designed to be sufficiently strong to rotate magnetization moments of the SAMIs 30 and the MAMI 60 from the easy axes to the hard axes into a neutral logic state such that fringing fields from the neighbor SAMI/MAMI can set a given device into a logically correct state.

The distances between adjacent SAMIs 30 and the MAMI 60 disposed on the substrate 20 should be designed so that magnetic flux lines are sufficiently strong enough to magnetically influence each other.

Although all of the SAMIs 30 do not necessarily have to be along the plane 50 of the substrate 20, one envisioned configuration is that all of the SAMIs 30 are disposed along the plane 50 of the substrate 20.

Although all of the SAMIs 30 do not necessarily have to be disposed perpendicular or parallel to the sweeping direction of the applied magnetic clock field 40, one envisioned configuration is that all of the SAMIs 30 are disposed either substantially perpendicular or substantially in parallel relative to the sweeping direction of the applied magnetic clock field 40.

Although all of the SAMIs 30 do not necessarily have lengths longer than their respective widths, some SAMIs 30 may even have circular shapes. One envisioned configuration is that all of the SAMIs 30 have lengths longer than their respective widths. Another envisioned geometric configuration is that some of the SAMIs 30 have elongated rectangular shapes.

The MAMI 60 may be any geometrically and/or angularly misaligned magnetic island (2 or 3 dimensional) configuration in which some of 2 dimensional configurations are depicted in FIG. 6. One envisioned geometric configuration of the MAMI 60 is that it has a slant edged rectangular shape which is substantially lined up parallel and/or perpendicular to the sweeping direction of the applied magnetic clock field 40. Another envisioned configuration is that the MAMI 60 has an elongated rectangular shape (i.e., symmetrical in geometry) that is aligned so that it is not parallel and not perpendicular (i.e., angularly misaligned) to the sweeping direction of the applied magnetic clock field 40.

One mode of the sweeping direction of the applied magnetic clock field 40 is that it is left to right with respect to the substrate 20. Another sweeping direction of the applied magnetic clock field 40 is right to left with respect to the substrate 20.

An envisioned orientation of the applied magnetic clock field 40 is that it is applied substantially parallel to the plane 50 of the substrate 20. Another envisioned orientation of the applied magnetic clock field 40 is that it is applied substantially perpendicular to the plane 50 of the substrate 20.

An envisioned distributive arrangement of the SAMIs 30 is that some of the SAMIs 30 are aligned to form antiferromagnetic coupled binary wires 130. Still another envisioned distributive arrangement of the SAMIs 30 is that some of the SAMIs 30 are aligned to form ferromagnetic coupled binary wires 140.

An envisioned arrangement of the MAMI 60 sandwiched between two SAMIs 30 is that it comprises an OR gate as shown in FIGS. 9, 10, and 21*a*-*b*. Yet another envisioned arrangement of the MAMI 60 sandwiched between two SAMIs 30 is that it comprises an AND gate as shown in FIGS. 7, 8 and 21*c*-*d*. Still another envisioned arrangement of the MAMI 60 sandwiched between two SAMIs 30 is that it comprises a NAND gate as shown in FIG. 11. Still yet another envisioned arrangement of the MAMI 60 sandwiched between two SAMIs 30 is that it comprises a NOR gate as shown in FIG. 12. Accordingly the device 10 may comprise any number of logic functions which can include AND, OR, NAND, NOR and even comprise a logical memory like a bit of MRAM.

A envisioned arrangement of the MAMI 60 sandwiched between two SAMIs 30 is that they are all together substantially aligned perpendicular to the sweeping direction of the applied magnetic clock field 40. Still another envisioned arrangement of the MAMI 60 sandwiched between two SAMIs 30 is that they are all together aligned substantially in parallel with respect to the sweeping direction of the applied magnetic clock field 40.

Figure 15:
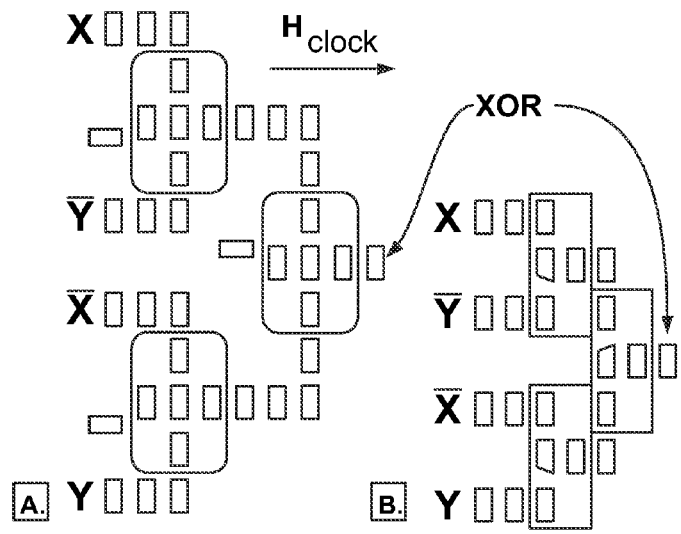
FIG. 15*a* is an XOR logic gate configuration using majority gates.
FIG. 15*b* is an XOR logic gate configuration using non-majority logic gate device the present invention.
Figure 16:
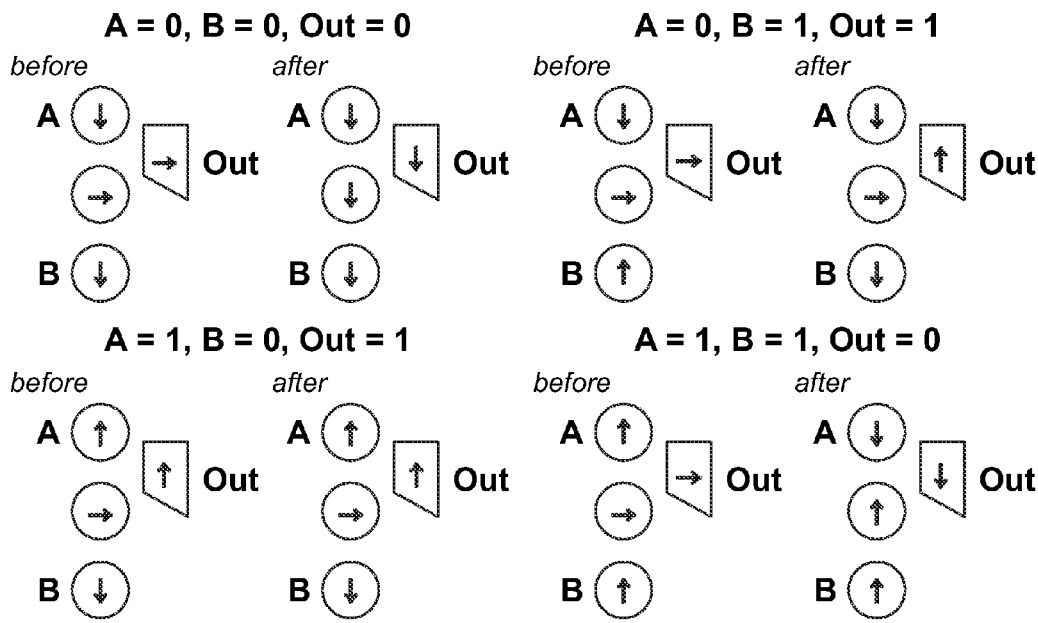
FIG. 16 is another XOR logic gate configuration using non-majority logic gate device of the present invention.

An envisioned example of the device 10 is that the MAMIs 60 are magnetically coupled and sandwiched between pairs of SAMIs 30 to form an XOR gate as shown in FIG. 15.

The compositional makeup of the SAMIs 30 and MAMIs 60 may be made of any known material so long as they exhibit magnetic properties. For example, it is envisioned that the SAMIs 30 and the MAMI 60 can be composed of magnetic material selected from the group consisting of a rare earth metal, ferrites, hipernom, hipernik, HyMu-80, monimax, Mo-permalloy, nilomag, remalloy, sanbold, supermumetal, ultraperm, vicalloy, 78 Permalloy, permalloy, supermalloy, AlNiCo, AlSiFe (sendust), Co, CoFe, CoFeB, CoFeV (supermendur), CoFeCr (hiperco), CoPt, CoZrTa, CoFe (permendur), CuZn, FeN, FeO, FeAlN, FeTaN, NiFe (permalloy), NiFeMo supermalloy, NiFe supermalloy, NiFeCuCr (mumetal), NiFeCo, MnZn, and combinations thereof.

The non-majority magnetic logic gate device 10 may also further comprise a plurality of MAMIs 60 in which the MAMIs 60 are magnetically coupled and sandwiched between corresponding respective pairs of SAMIs 30.

The non-majority magnetic logic gate device 10 may also further comprise a plurality of MFOs 80 magnetically coupled to the MAMIs 60. It is important to note that the MFOs 80 do not necessarily have to be immediately adjacent to the MAMIs 60. That is either antiferromagnetic or ferromagnetic coupled binary wire 140*s* (as shown in FIGS. 1-3 and 13-14 can be used to magnetically couple any of the MAMIs 60 to their respectively coupled MFOs 80.

The non-majority magnetic logic gate device 10 may also further comprise an XOR gate which is composed of three adjacent SAMIs 30 aligned linearly together and one MAMI 60. The three linearly aligned together adjacent SAMIs 30 are magnetically coupled to each other and the one MAMI 60 is magnetically coupled to a middle one of the three adjacent SAMIs 30.

The non-majority magnetic logic gate device 10 may also further comprise an applied magnetic clock field 40 circuit 120 configured to produce and to sweep the applied magnetic clock field 40.

The non-majority magnetic logic gate device 10 may also further comprise a dielectric layer 90, a cladding layer 100, a fill layer 110, and an applied magnetic clock field 40 circuit 120. It is preferable that the dielectric layer 90 is disposed on the substrate 20 and the cladding layer 100 is on the dielectric layer 90. It is also preferable that the fill layer 110 on the cladding layer 100 and applied magnetic clock field 40 circuit 120 buried in the fill layer 110.

Another envisioned example of the present invention is that it comprises a non-majority magnetic logic gate device 10. The non-majority magnetic logic gate device 10 of this example comprises a substrate 20, a plurality of SAMIs 30, a MAMI 60, a plurality of MFIs 70 and a MFO 80. The plurality of SAMIs 30 are disposed on the substrate 20 such that most of the SAMIs 30 are disposed either substantially perpendicular or substantially in parallel relative to a sweeping direction of an applied magnetic clock field 40 so that the applied magnetic clock field 40 is applied substantially parallel or perpendicular to a plane 50 of the substrate 20. Most of the SAMIs 30 have lengths longer than widths that respectively define easy and hard magnetic axes and that most of the SAMIs 30 are electrically isolated from each other. Of those SAMIs 30 that are symmetrically aligned lengthwise side by side next to each other tend towards exhibiting antiferromagnetic coupling with each other. Of those SAMIs 30 that are symmetrically aligned widthwise side by side next to each other tend towards exhibiting ferromagnetic coupling with each other. Three adjacent SAMIs 30 aligned linearly together are magnetically coupled to each other. The MAMI 60 is also disposed on the substrate 20 in which the MAMI 60 is configured to have a length longer than a width that respectively define easy and hard magnetic axes. Accordingly, the MAMI 60 is configured to exhibit a magnetization ground state bias which is dependent upon the sweeping direction of the applied magnetic clock field 40 and that the MAMI 60 is electrically isolated from the SAMIs 30. The MAMI 60 is also disposed next to the three adjacent SAMIs 30 so that the MAMI 60 is magnetically coupled to only a middle one of the three adjacent SAMIs 30 in which the three adjacent SAMIs 30 and the MAMI 60 comprise an XOR gate. The MFIs 70 are also disposed on the substrate 20 and magnetically coupled to some of the SAMIs 30. The MFO 80 is also disposed on the substrate 20 and magnetically coupled to the MAMI 60.

Yet another envisioned example is that present invention can comprise a magnetic logic gate array 150. The magnetic logic gate array 150 comprises a substrate 20; a plurality of non-majority magnetic logic gate devices 10, MFIs 70 and MFOs 80. The non-majority magnetic logic gate devices 10 are disposed on the substrate 20 in which the devices 10 comprises SAMIs 30 and MAMIs 60. The SAMIs 30 are disposed on the substrate 20 in which most of the SAMIs 30 are disposed either substantially perpendicular or substantially in parallel relative to a sweeping direction of an applied magnetic clock field 40 such that the applied magnetic clock field 40 is applied substantially parallel or perpendicular to a plane 50 of the substrate 20. Most of the SAMIs 30 having lengths longer than widths that respectively define easy and hard magnetic axes and that most of the SAMIs 30 are electrically isolated from each other. Of those SAMIs 30 that are symmetrically aligned lengthwise side by side next to each other tend towards exhibiting antiferromagnetic coupling with each other. Of those SAMIs 30 that are symmetrically aligned widthwise side by side next to each other tend towards exhibiting ferromagnetic coupling with each other. The MAMIs 60 are also disposed on the substrate 20 in which the MAMIs 60 have lengths longer than widths that respectively define easy and hard magnetic axes and that the MAMIs 60 are electrically isolated from the SAMIs 30. Most MAMIs 60 are magnetically coupled and sandwiched in between corresponding pairs of adjacent SAMIs 30. The MAMI 60 is configured, i.e., geometrically and/or angularly misaligned, to exhibit a magnetization ground state bias which is dependent upon the sweeping direction of the applied magnetic clock field 40. The MFIs 70 are disposed on the substrate 20 and magnetically coupled to some of the SAMIs 30. The MFOs 80 are disposed on the substrate 20 and magnetically coupled to the MAMIs 60.

The following simulated examples were generated using the Object Oriented Micro-Magnetic Framework (OOMMF) developed by the National Institute of Standards and Technology (NIST). The OOMMF uses a Landau-Lifshitz ODE solver to relax 3D spins on a 2D mesh of square cells. Unless otherwise note, all of the following simulations assume magnets made from supermalloy (79% Ni, 15% Fe, and 5% Mo) which is a soft magnetic material with a uniaxial anisotropy constant of essentially zero. Thus there is no easy/hard axis associated with the magnetic material itself and any easy/hard axis is only defined by the magnet shape. Unless otherwise noted, a saturation magnetization of $8.0 \times 10^5$ A/m and an exchange stiffness constant of $1.05 \times 10^{-11}$ J/m are used to model supermalloy. It is also assumed that the damping coefficient is 0.1, instead of 0.5, which corresponds more to experimental results. A stopping criteria, i.e., dm/dt, was chosen instead of a time cutoff. Each OOMMF simulation time step step was only considered to be complete when the maximum change in magnetization per unit time (across all spins associated with a given circuit element) fell below 1 degree/ns. A stopping criteria, i.e., dm/dt, was chosen instead of a time cutoff. Finally, unless otherwise noted, all simulated magnets were set to have a footprint of $50 \times 75 \times 25$ nm$^3$.

Simulation Example 1

Asymmetry and Magnetization Behavior

Figure 17:
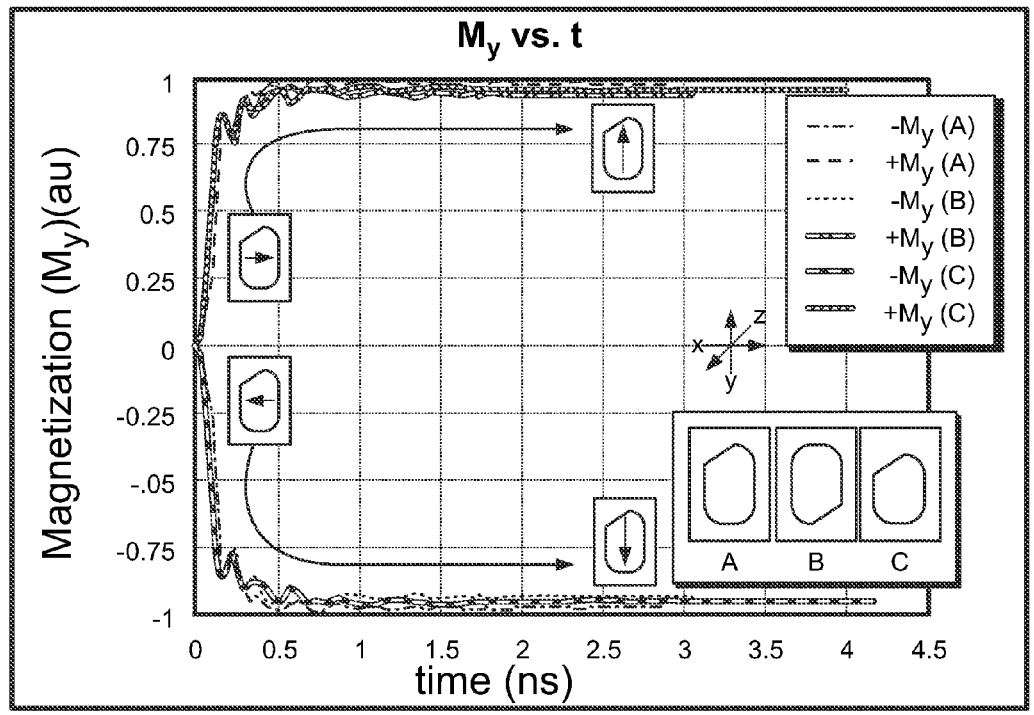
FIG. 17 is Magnetization (My) as a function of time for slant edged MAMIs where the initial magnetization was originally along the x-axis and at the saturation magnetization.

Simulations of magnetic properties of magnets having "slanted" or "cut" edges as illustrated in the inserts in FIG. 17. In the simulations three slanted magnets initially have a strong x-component of magnetization (e.g., they are biased along their hard/short axes). If no field is applied to keep a given device in this metastable state, and the magnetic material is polycrystalline (e.g., permalloy or supermalloy), then the devices should relax into a magnetization state determined by its easy/long axis. In clocked lines of magnets, the fringing fields from a neighboring device will ideally determine the sign of the final magnetization state. In the presence of no applied bias, what state a magnet with a rounded rectangular shape might eventually relax into would essentially be random.

However, as magnetic moments tend to align along a magnet's edge, a slanted edge can give a device a envisioned y-component of magnetization. Both the position of the slant and the initial x-component (direction) of magnetization both dictate what state a device will ultimately relax to. This effect is captured quantitatively in FIG. 17 where we considered three magnets with slanted edges. Slant edge magnets v1 and v2 have a $50 \times 75 \times 25$ nm$^3$ footprints and v3 has a $40 \times 60 \times 20$ nm$^3$ footprint. Each slant edge magnet device was initialized with both a positive and negative x-component of magnetization and was allowed to relax with no external clocking field or Hy bias applied. The placement of the slant and the direction of the initial x-component of the magnetization consistently lead to a envisioned y-component of magnetization of each of the slant edge magnet devices (e.g., ↑ or ↓ states).

Simulation Example 2

Asymmetry and Magnetization Behavior

Figure 19:
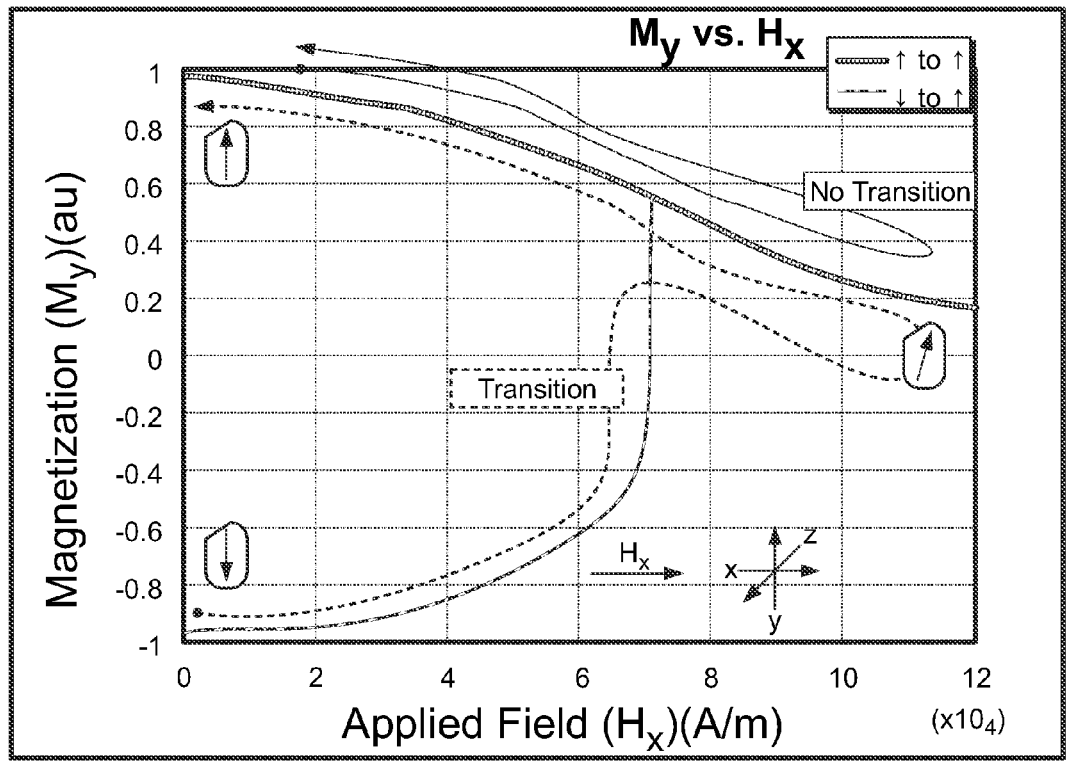
FIG. 19 is a magnetization profile along a y-axis (My) of a MAMI magnet as a function of applied magnetic field along the x axis (Hx) that depicts asymmetric behavior.

If a magnet with a slanted edge on its upper left initially has a strong positive y-component of magnetization and an external field is applied from left-to-right along its hard axis and then removed, there is no My state change. If the initial y-component of magnetization is negative and the same field is applied even with no Hy bias, there is an My state change. In FIG. 19 this phenomenon is seen via OOMMF simulation of supermalloy magnets with various sizes and shapes. Slant position and direction of the Hx field/initial Mx state determine the final My state.

Figure 18:
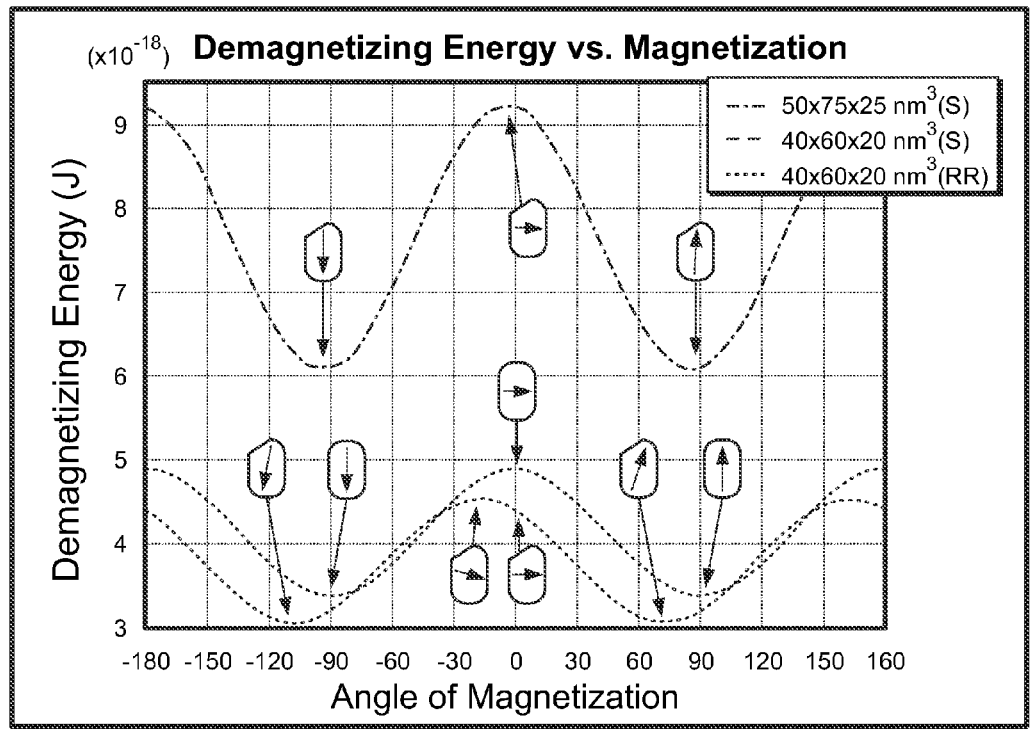
FIG. 18 is a demagnetizing energy profile as a function of magnetization angle for two MAMI asymmetric magnets (S) and a symmetric rounded rectangular magnet (RR)

The My state transition can be explained by plotting a device's demagnetizing energy, i.e., the internal energy that opposes the direction of magnetization, as a function of angle of magnetization FIG. 18. Each peak of the asymmetrical (i.e., slant) magnets is not centered at zero degrees as compared to the case for a symmetric rounded rectangular magnet. Rather each peak of the asymmetrical magnets is shown shifted to the left. This explains the My sign change in FIG. 18. The maximum magnetization energy is at an angle below horizontal. If the applied Hx field causes a device to move past this angle, even if some initial y-component of magnetization is retained, when Hx is removed, the devices relax such that My is positive.

In our second set of simulations, we again considered a magnet in isolation with a slanted edge in isolation (specifically slant edge magnet v1 of FIG. 17). As in the first simulation example the slant edge magnet was initially magnetized such that its y-component of magnetization was equal to the saturation magnetization (Ms) of supermalloy (↑). We then applied an external field along the magnet's hard axis (in the positive x-direction) that increased in magnitude from 0 A/m to 120,000 A/m in 800 A/m increments. The field was then removed in a similar fashion. These simulations results are illustrated in FIG. 19. Note that this device always retains some of its initial y-component of magnetization state (↑). Next, the slant edge magnet was in an initial state such that My was negative (↓). Again, we applied a field along the device's hard axis, from left-to right, then gradually increased in magnitude. Given these initial conditions, when the external field (Hx) reaches 70,000 A/m, the position of the slant and the direction of the applied field include a transition from a down state (↓) to an up state (↑) even with no Hy bias is applied to the device.

Simulation Example 3

Asymmetry and Magnetization Behavior

Magnetic state changes (e.g., from ↑ or ↓) can also be facilitated with combinations of hard axis and fringing fields as well. The clocking fields (Hx) place each magnet in an ensemble into a state such that it can be switched into a new, logically correct state by its neighbor's fringing fields (i.e., Hy).

Figure 20:
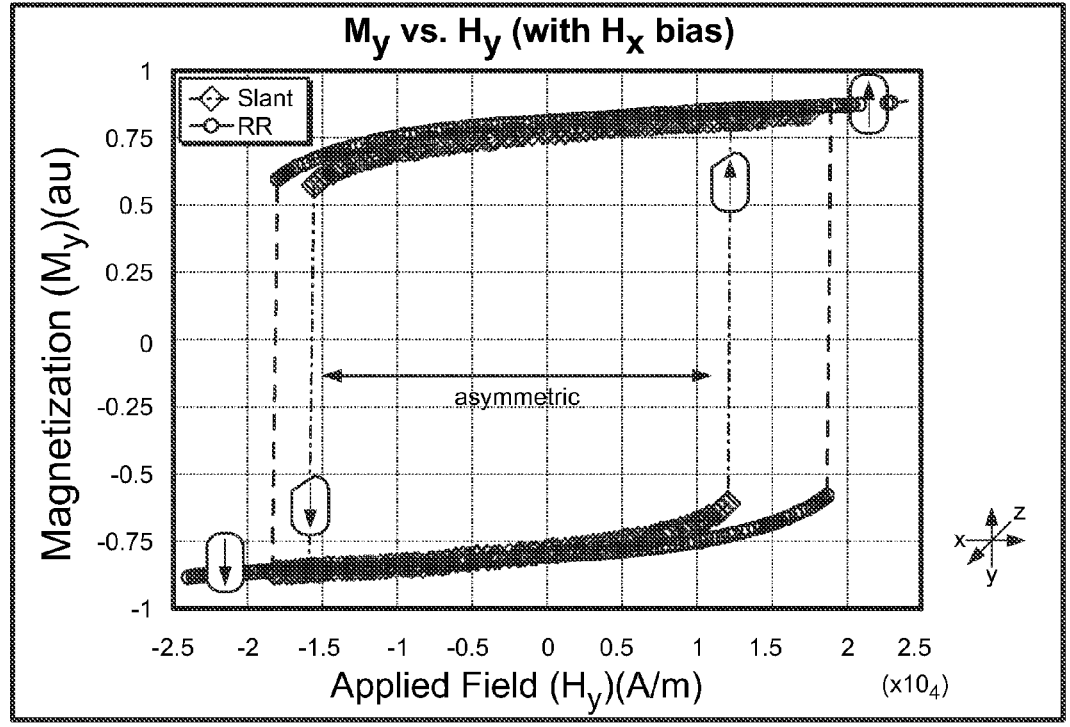
FIG. 20 is M-H curves for symmetrical and asymmetrical magnets.

This effect is depicted quantitatively in FIG. 20 where a rounded rectangular and a slanted edge magnet were considered. Each simulated magnet was set to have a 50×75 nm$^2$ footprint and a constant 46,000 A/m bias was applied along a mangnet's hard axis in each case. For each shape, a magnet can transition from a ↑ or ↓ state with a significantly lower Hy bias. However, while the M-H curve for the rounded rectangle device is symmetric (the same bias is required to facilitate an ↑ to ↓ and ↓ to ↑ transition), the M-H curve for the magnet with a slanted edge is asymmetric. Given the direction of the applied field (Hx) and the device's initial state, a stronger field is required to make the magnet transition to a state against that suggested by the position of its slant, e.g., 12,334 A/m field is required for a ↑ to ↓ transition while a field of 15,915 A/m is required for a ↑ to ↓ transition. Still, while a 30% larger Hy bias is needed, a state transition "against" the slant and direction is still possible.

Simulation Example 4

Asymmetry and Logic

FIG. 21*a* depicts a 3 magnet ensemble which implements a logic OR function. If $i_1$ and $i_2$ have the same My state, output magnet 'o' will see a net Hy bias that induces ferromagnetic ordering in $i_1$, o, and $i_2$. If the magnet is sufficiently nulled, fringing fields from the two inputs will also influence the output magnet's My state. The bias needed to facilitate a state transition for ferromagnetic ordering (in the presence of a given Hx field) can be determined via an M-H curve generated via OOMMF simulation (See FIG. 20). While the M-H curve for a magnet with a slanted edge is asymmetric, if the two input magnets could provide the higher Hy bias, they can facilitate the state transitions required for the top and bottom input combinations in the truth table of FIG. 21*b*. As shown in FIG. 21*c-d*, a 2-input AND can be realized if the slanted edge is on the bottom left.

In an actual circuit, the Hy biases will not be externally applied but instead will come from neighboring devices. For example, referring back to FIG. 21*a*, the fringing fields from $i_1$ and $i_2$ might generate the Hy bias that ultimately sets the state of the slanted output magnet. With this configuration, there are four combinations of magnetization states that and $i_2$ could represent (See FIG. 21*b*). Based on the simulation results, if the "target" magnet with the slanted edge were initially biased such that Mx=Ms, and the input magnets were in opposite magnetization states, the target magnet would be expected to settle into a ↑ state—as the fringing fields from the two inputs effectively cancel. Similarly, if the target magnet is sufficiently biased along its hard axis, and the combined Hy biasing fields from $i_1$ and $i_2$ are sufficiently strong, then they are expected to be able to set the magnetization state My of the slant-edge target. If we equate a ↓ state to a binary 0 and a ↑ state to a binary 1, a magnet with a slanted edge could implicitly implement the logic OR function. Note that if the slanted edge were on the bottom left as shown in FIG. 21*c*, a logic AND function would result (FIG. 21*d*).

The average Hy bias produced by a 50×75×25 nm$^3$ supermalloy magnet even 15 nm away from a potential target is ~25,000 μm. Thus, even if both input magnets in FIG. 21*a* have the same magnetization state, FIG. 20 suggests that the fringing fields from the magnets alone will be insufficient to switch the state of the target (as the MH curves there also include a 46,000 A/m Hx bias). This suggests that we will also need to leverage an external/clock field applied along a target magnet's hard axis in order to facilitate any potential state change given the biases that 2 inputs might actually provide at some reasonable distance away. We are particularly interested in facilitating a state transition with the smallest external field possible as larger currents would be needed to generate larger fields per the mechanism in FIG. 14—which will only increase system energy demands.

We consider a circuit structure like that illustrated in FIG. 21*a*. The target magnet was initialized to a state opposite of that suggested by each of the four possible input combinations. (There are four possible state transitions.) In each instance, a field was applied parallel to the target magnet's hard axis. Our objective was to measure the magnitude of the external field required to facilitate a state transition. Three of the four simulation results are reported in FIG. 22. (The ↑↓↑ to ↑↑↑ case is the "easiest" and is now shown to improve graph readability.) As one can see, higher external fields are required for the case where inputs are in opposite magnetization states. (This makes sense as there is essentially no Hy helper bias.) However, the simulations where inputs with opposite magnetization states are not symmetric—e.g., a greater external field is required if the top input is ↑ and the bottom input is ↓ than if the bottom input is ↑ and the top input is ↓.

Figure 21:
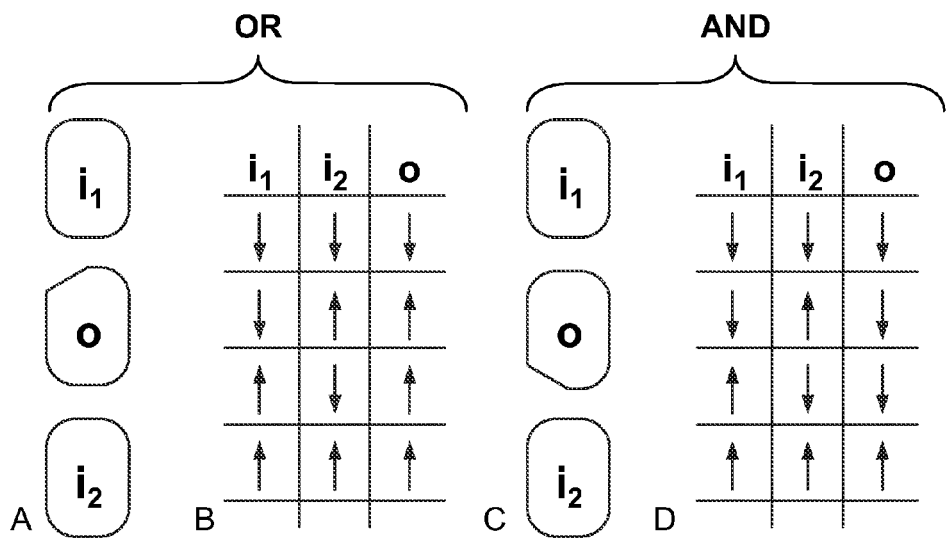
FIG. 21*a* is a non-majority OR gate of the present invention.
FIG. 21*b* is a truth table for the non-majority OR gate of the present invention.
FIG. 21*c* is a non-majority AND gate of the present invention.
FIG. 21*d* is a truth table for the non-majority AND gate of the present invention.
Figure 22:
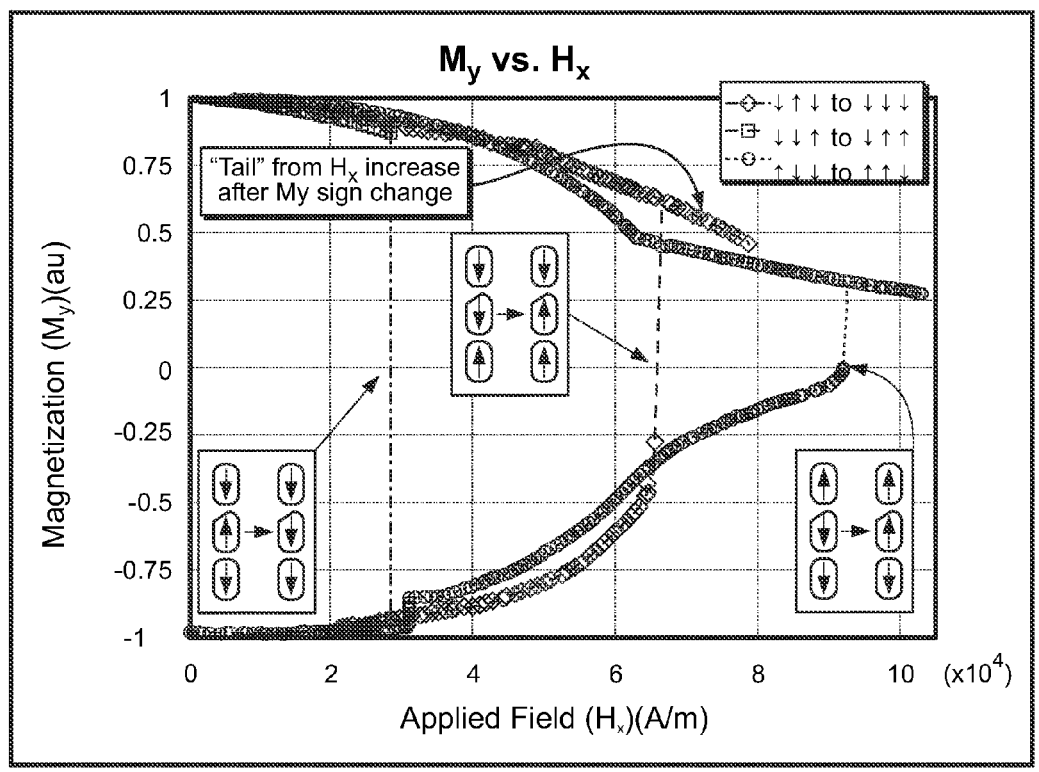
FIG. 22 is a magnetization profile along a y-axis (My) of a MAMI magnet as a function of applied magnetic field along the x axis (Hx) showing different threshold energetics for three different transitions in a non-majority gate.

This can be explained quantitatively by considering the structure illustrated in FIG. 21 when the line is in a ferromagnetically ordered state (e.g., all devices are ↓). If we measure the flux density 2 nm away from the top and bottom of the magnet with the slanted edge, the average flux density is approximately 13% higher between o and $i_2$ than between o and $i_1$ (See Table 1). In essence, the position of the slant on the top of the target leads to weaker coupling between $i_1$ and o than between $i_2$ and o. Thus, when the bottom magnet is in an ↑ state, and the top magnet is in a ↓ state, not only does the bottom magnet exert more control over the target, but it is also pushing the target to a logically correct state. For the opposite input combination, a greater external field is required as we essentially need to overcome the effects of a small "anti-bias" from the bottom magnet in a ↓ state.

TABLE 1

Effect of By on target magnet with different spacings between input and target with slanted edges

| Case | Distance (nm) | Avg By (mT) |
| --- | --- | --- |
| Target - Bottom | 15 | −416 |
| Target - Top | 15 | −336 |
| Target - Top | 10 | −417 |
| Target - Bottom | 15 | −413 |

Simulation Example 5

Asymmetry and Logic

Figure 23:
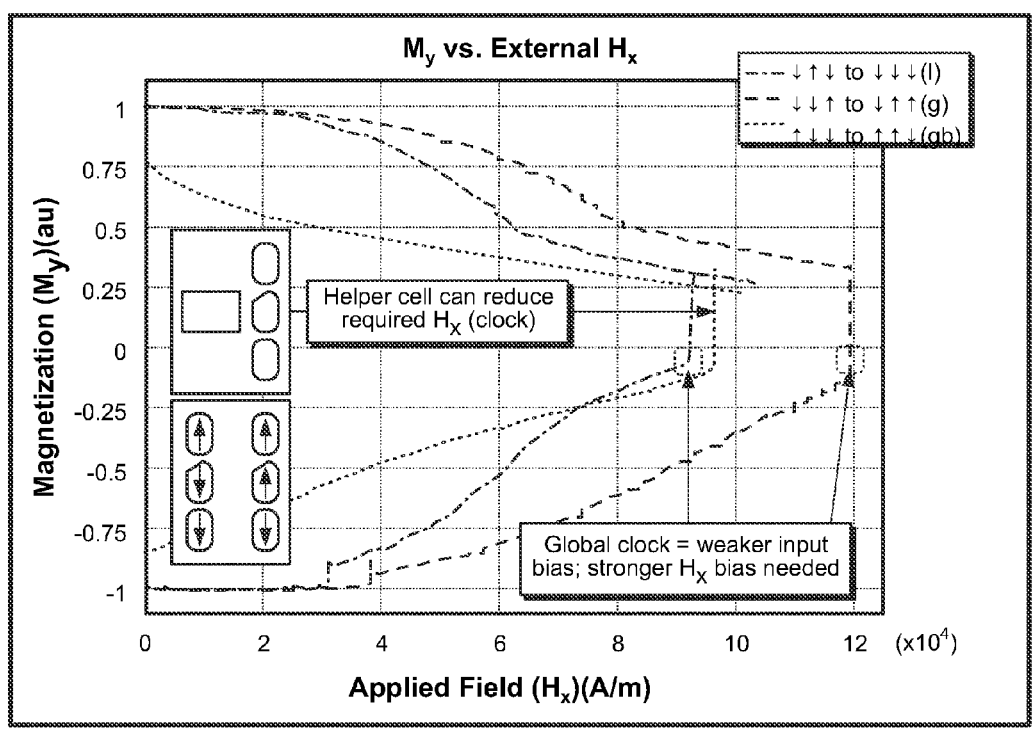
FIG. 23 is a magnetization profile along a y-axis (My) of a MAMI magnet as a function of applied magnetic field along the x axis (Hx) showing different threshold energetics for the same transition a non-majority gate as a function of Hx with or without a helper cell.

As magnetic field strength is a function of distance, if allowable by a fabrication process, one way to ensure that both inputs have equal control over a slanted target is to change the distance between $i_1$ and o as depicted in FIG. 21a. This effect is illustrated quantitatively in FIG. 23 where the ↑↓↓ to ↑↑↓ in case is again considered. Like the simulation results summarized in FIG. 22, we simulated an applied local field along the target magnet's hard axis. However, in this simulation, the spacing between $i_1$ and o was 10 nm instead of 15 nm. (The spacing between $i_2$ and o remained at 15 nm.) As seen in FIG. 23, the target magnet now changes state with a lower magnitude field (Hx). Similarly, from Table 1, in a ferromagnetically ordered line, the flux density between the top and bottom inputs and the target is essentially equal. Again, if enabled by a given fabrication process, these results suggest that asymmetric placement of the two inputs could allow for lower field and hence lower energy operations as the previous "worst case" is mitigated.

Finally, it is noted that realistically, an external field will not simply be applied to just a slanted target but rather the external field will be applied to all magnets in the ensemble. As such $i_1$ and $i_2$ will become weaker drivers as the clocking field will increase each magnet's x-component of magnetization. As also seen in FIG. 23, the net effect of this is that a higher external field is required to facilitate a state transition in symmetric ↑↓↓ to ↑↑↓ case.

Simulation Example 6

Fringing Field Magnitude

One important design parameter is magnet "drive strength", e.g., how much of a bias will it produce on the neighboring device that it is supposed to drive. To determine which shape configuration produces a stronger Hy bias, we consider each configuration in both states via simulation and measure the field produced on an equivalently sized footprint 15 nm away (assuming a magnet will drive a neighbor to its right). As seen in Table II the "slant on the left" configuration is an approximately 18% stronger driver.

TABLE II

Hy bias produced by 50 × 75 × 25 $nm^3$ supermalloy target magnet 15 nm away

| Magnet | State | Avg. Hy bias (A/m) |
| --- | --- | --- |
| Slant left | up | −17866 |
| Slant left | down | 17866 |
| Slant right | up | −15133 |
| Slant right | down | 15133 |

Simulation Example 7

Clocking

Another important design parameter is the magnitude of the external field required to facilitate a state transition. As such, we also studied which slant placement makes it easier to put a device into a metastable state as suggested by the input combinations that require state transitions. Again, four different configurations are considered: (i) a target that is initially in a state dictated by the slant and the direction of the applied switching field and where the inputs would suggest a state transition against the envisioned direction of the slant, and (ii-iv) a target that is initially in a state against that dictated by the slant and the direction of the applied switching field and where we cycle through all input combinations to put it into a correct state. (Here, the "hard cases" occur when the fringing fields from each input cancel and the slant determines the state transition.)

For each of these configurations we considered a 3 magnet line terminated by the block. The first magnet in the line was slanted. Local fields were applied over the target/slanted magnet to mimic new input drivers and the external field applied to this system was increased from 0 until all of the magnets in the line switched into the logically correct state suggested by the applied local fields. We studied the state of the last magnet in the line as a function of the applied clock—as this captures proper switching behavior of the line. Again, we found that the "slant left" placement allows for each simulation to transition into a logically correct state with the lowest overall external field. (With the "slant right" configuration, there is less coupling between the input magnet (a MAMI) and its right neighbor (a SAMI) which makes it more difficult for the other magnets in the line to transition through a metastable state. It is worth noting that if inputs are asymmetric, larger external fields are required. This maximum external field would then become a system design parameter as it would ensure that all the lines will transition correctly for all input combinations. Given these results, a gate with a slant on the left should require lower fields to transition to a neutral state, and can be a stronger driver.

Simulation Example 8

Shape Gate v Majority Gate

A two input XOR gate is used as a vehicle to discuss how shape-based logic can impact system level performance. The implicit majority voting function associated with magnetic logic will not enable a more efficient two input XOR gate. Majority gates must be reduced to AND/OR gates to implement the Boolean function A'B+B'A. A schematic of what a gate might look like if it were to be constructed with nanomagnets appears in FIG. 15. (A majority gate design appears in FIG. 15a and a shape-based design appears in FIG. 15b.). The shape based design reduces extraneous interconnection which can in turn reduce gate delay by approximately 25% and reduce the gate footprint by almost 60%. As automata-like local interconnect and slower magnet switching times can only degrade performance, a shape based logic approach can only improve system level performance. Additionally, shape based logic gates appear to be controllable with the same fields necessary to control antiferromagnetic order bit lines of similarly sized magnets (good from the standpoint of system-level energy).

As to the manner of usage and operation of the present invention, the same should be apparent from the above description. Accordingly, no further discussion relating to the manner of usage and operation will be provided.

While an envisioned example of the non-majority magnetic logic gate device has been described in detail, it should be apparent that modifications and variations thereto are possible, all of which fall within the true spirit and scope of the invention. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

Those of ordinary skill in the art will appreciate that the apparatus and methods described herein are susceptible to variations and modifications other than those specifically described. It is to be understood that the invention includes all such variations and modification which fall within its spirit and scope.

Therefore, the foregoing is considered as illustrative only of the principles of the invention. Further, since numerous modifications and changes will readily occur to those of ordinary skill in the art, it is not desired to limit the invention to the exact construction and operation shown and described, and accordingly, all suitable modifications and equivalents may be resorted to, falling within the scope of the invention.

What is claimed is:

1. A non-majority magnetic logic gate device comprising
a substrate;
a plurality of symmetrically aligned magnetic islands (SAMIs) disposed on the substrate, wherein
most of the SAMIs are disposed either substantially perpendicular or substantially in parallel relative to a sweeping direction of an applied magnetic clock field such that the applied magnetic clock field is applied substantially parallel or perpendicular to a plane of the substrate;
most of the SAMIs having a length longer than a width that respectively define easy and hard magnetic axes,
most of the SAMIs are electrically isolated from each other,
those SAMIs that are symmetrically aligned lengthwise side by side next to each other tend towards exhibiting antiferromagnetic coupling with each other, and
those SAMIs that are symmetrically aligned widthwise side by side next to each other tend towards exhibiting ferromagnetic coupling with each other;
a misaligned magnetic island (MAMI) disposed on the substrate wherein
the MAMI having a length longer than a width that respectively define easy and hard magnetic axes,
the MAMI is electrically isolated from the SAMIs,
the MAMI magnetically coupled and sandwiched in between two SAMIs, and
the MAMI exhibiting a magnetization ground state bias which is dependent upon the sweeping direction of the applied magnetic clock field;
a plurality of magnetic field inputs (MFIs) disposed on the substrate and magnetically coupled to some of the SAMIs; and
a magnetic field output (MFO) disposed on the substrate and magnetically coupled to the MAMI.

2. The device of claim 1 further comprising a plurality of MAMIs magnetically coupled and sandwiched between pairs of SAMIs.

3. The device of claim 2 further comprising a plurality of MFOs magnetically coupled to the MAMIs.

4. The device of claim 2 further comprising an XOR gate, the XOR gate comprising:
three adjacent SAMIs aligned linearly together so that the three adjacent SAMIs are magnetically coupled to each other; and
one MAMI magnetically coupled to a middle one of the three adjacent SAMIs.

5. The device of claim 2 wherein the MAMIs magnetically coupled and sandwiched between pairs of SAMIs comprise an XOR gate.

6. The device of claim 1 further comprising an applied magnetic clock field circuit configured to produce and to sweep the applied magnetic clock field.

7. The device of claim 1, further comprising:
a dielectric layer on the substrate;
a cladding layer on the dielectric layer;
a fill layer on the cladding layer; and
an applied magnetic clock field circuit buried in the fill layer.

8. The device of claim 1 wherein all of the SAMIs are disposed along the plane of the substrate.

9. The device of claim 1 wherein all of the SAMIs are disposed either substantially perpendicular or substantially in parallel relative to the sweeping direction of the applied magnetic clock field.

10. The device of claim 1 wherein all of the SAMIs have lengths longer than their respective widths.

11. The device of claim 1 wherein some of the SAMIs have elongated rectangular shapes.

12. The device of claim 1 wherein the MAMI has a slant edged rectangular shape.

13. The device of claim 1 wherein the MAMI has an elongated rectangular shape that is aligned so that it is not parallel and not perpendicular to the sweeping direction of the applied magnetic clock field.

14. The device of claim 1 wherein the sweeping direction of the applied magnetic clock field is left to right with respect to the substrate.

15. The device of claim 1 wherein the sweeping direction of the applied magnetic clock field is right to left with respect to the substrate.

16. The device of claim 1 wherein the applied magnetic clock field is substantially parallel to the plane of the substrate.

17. The device of claim 1 wherein the applied magnetic clock field is substantially perpendicular to the plane of the substrate.

18. The device of claim 1 wherein some of the SAMIs that are aligned lengthwise next to other SAMIs comprise an antiferromagnetic coupled binary wire.

19. The device of claim 1 wherein some of the SAMIs that are aligned widthwise next to other SAMIs comprise a ferromagnetic coupled binary wire.

20. The device of claim 1 wherein the MAMI magnetically coupled and sandwiched between two SAMIs comprises an OR gate.

21. The device of claim 1 wherein the MAMI magnetically coupled and sandwiched between two SAMIs comprises an AND gate.

22. The device of claim 1 wherein the MAMI magnetically coupled and sandwiched between two SAMIs comprises an NOR gate.

23. The device of claim 1 wherein the MAMI magnetically coupled and sandwiched between two SAMIs comprises an NAND gate.

24. The device of claim 1 wherein the device is an MRAM.

25. The device of claim 1 wherein the MAMI magnetically coupled and sandwiched between two SAMIs are together aligned perpendicular to the sweeping direction of the applied magnetic clock field.

26. The device of claim 1 wherein the MAMI magnetically coupled and sandwiched between two SAMIs are together aligned in parallel with respect to the sweeping direction of the applied magnetic clock field.

27. The device of claim 1 wherein the MFO is magnetically coupled to the MAMI through a magnetically coupled binary wire.

28. The device of claim 1 wherein the applied magnetic clock field exhibiting a frequency between 1 Hz to about 1 GHz.

29. The device of claim 1 wherein the SAMIs and the MAMI are composed of magnetic material selected from the group consisting of a rare earth metal, ferrites, hipernom, hipernik, HyMu-80, monimax, Mo-permalloy, nilomag, remalloy, sanbold, supermumetal, ultraperm, vicalloy, 78 Permalloy, permalloy, supermalloy, AlNiCo, AlSiFe (sendust), Co, CoFe, CoFeB, CoFeV (supermendur), CoFeCr (hiperco), CoPt, CoZrTa, CoFe (permendur), CuZn, FeN, FeO, FeAlN, FeTaN, NiFe (permalloy), NiFeMo supermalloy, NiFe supermalloy, NiFeCuCr (mumetal), NiFeCo, MnZn, and combinations thereof.

30. The device of claim 1 wherein a strength of the applied magnetic clock field is sufficiently strong to rotate magnetization moments of the SAMIs and the MAMI from the easy axes to the hard axes into a neutral logic state.

31. The device of claim 1 wherein distances between adjacent SAMIs and the MAMI disposed on the substrate are proportional to an exerted SAMI magnetic field adjacent SAMIs such that magnetic flux lines from adjacent SAMIs magnetically couple each other through dipole-dipole interactions and such that that magnetic flux lines from SAMIs adjacent to the MAMI magnetically couple to the MAMI through dipole-dipole interactions.

32. A non-majority magnetic logic gate device comprising:
a substrate;
a plurality of symmetrically aligned magnetic islands (SAMIs) disposed on the substrate, wherein
  most of the SAMIs are disposed either substantially perpendicular or substantially in parallel relative to a sweeping direction of an applied magnetic clock field such that the applied magnetic clock field is applied substantially parallel or perpendicular to a plane of the substrate;
  most of the SAMIs having a length longer than a width that respectively define easy and hard magnetic axes,
  most of the SAMIs are electrically isolated from each other,
  those SAMIs that are symmetrically aligned lengthwise side by side next to each other tend towards exhibiting antiferromagnetic coupling with each other,
  those SAMIs that are symmetrically aligned widthwise side by side next to each other tend towards exhibiting ferromagnetic coupling with each other,
  three adjacent SAMIs aligned linearly together so that the three adjacent SAMIs are magnetically coupled to each other;
a misaligned magnetic island (MAMI) disposed on the substrate wherein
  the MAMI having a length longer than a width that respectively define easy and hard magnetic axes,
  the MAMI exhibiting a magnetization ground state bias which is dependent upon the sweeping direction of the applied magnetic clock field; and
  the MAMI is electrically isolated from the SAMIs,
  the MAMI magnetically coupled to a middle one of the three adjacent SAMIs such that the three adjacent SAMIs and the MAMI comprise an XOR gate;
a plurality of magnetic field inputs (MFIs) disposed on the substrate and magnetically coupled to some of the SAMIs; and
a magnetic field output (MFO) disposed on the substrate and magnetically coupled to the MAMI.

33. A magnetic logic gate array comprising:
a substrate;
a plurality of non-majority magnetic logic gate devices on the substrate, the devices comprising:
  a plurality of symmetrically aligned magnetic islands (SAMIs) disposed on the substrate, wherein
    most of the SAMIs are disposed either substantially perpendicular or substantially in parallel relative to a sweeping direction of an applied magnetic clock field such that the applied magnetic clock field is applied substantially parallel or perpendicular to a plane of the substrate;
    most of the SAMIs having a length longer than a width that respectively define easy and hard magnetic axes,
    most of the SAMIs are electrically isolated from each other,
    those SAMIs that are symmetrically aligned lengthwise side by side next to each other tend towards exhibiting antiferromagnetic coupling with each other, and
    those SAMIs that are symmetrically aligned widthwise side by side next to each other tend towards exhibiting ferromagnetic coupling with each other;
  a plurality of misaligned magnetic islands (MAMIs) disposed on the substrate wherein
    the MAMIs having lengths longer than widths that respectively define easy and hard magnetic axes,
    the MAMIs are electrically isolated from the SAMIs,
    most MAMIs are magnetically coupled and sandwiched in between corresponding pairs of adjacent SAMIs, and the MAMI exhibiting a magnetization ground state bias which is dependent upon the sweeping direction of the applied magnetic clock field;
a plurality of magnetic field inputs (MFIs) disposed on the substrate and magnetically coupled to some of the SAMIs; and
a plurality of magnetic field outputs (MFOs) disposed on the substrate and magnetically coupled to the MAMIs.

* * * * *